United States Patent [19]

Lim

[11] Patent Number: 4,662,986

[45] Date of Patent: May 5, 1987

[54] PLANARIZATION METHOD AND TECHNIQUE FOR ISOLATING SEMICONDUCTOR ISLANDS

[75] Inventor: Sheldon C. P. Lim, Sunnyvale, Calif.

[73] Assignee: Signetics Corporation, Sunnyvale, Calif.

[21] Appl. No.: 749,596

[22] Filed: Jun. 27, 1985

[51] Int. Cl.[4] ................... B44C 1/22; C03C 15/00; C03C 25/06; B29C 17/08

[52] U.S. Cl. ................... 156/643; 29/576 W; 29/580; 156/646; 156/649; 156/651; 156/653; 156/657; 156/661.1; 156/668

[58] Field of Search ............ 29/571, 576 W, 580, 29/578; 357/49; 430/313; 156/643, 644, 646, 651, 652, 653, 655, 657, 659.1, 661.1, 662, 668, 648, 649; 427/38, 39, 93–95

[56] References Cited

U.S. PATENT DOCUMENTS

| | | | |
|---|---|---|---|
| 4,307,179 | 12/1981 | Chang et al. | 156/661.1 X |
| 4,389,281 | 6/1983 | Anantha et al. | 156/662 X |
| 4,470,874 | 9/1984 | Bartush et al. | 156/653 X |
| 4,505,025 | 3/1985 | Kurosawa et al. | 29/571 X |

OTHER PUBLICATIONS

Bartush et al., Dielectric Isolation Planarization, IBM Technical Disclosure Bulletin, vol. 21, No. 5, Oct. 1978, pp. 1868–1869.
Kinney et al., Method for Producing Single Crystal Silicon on an Insulating Substrate, *IBM Tech. Discl. Bulletin,* vol. 24, No. 6, Nov. 1981, pp. 2955–2957.
Tsang, Forming Wide Trench Dielectric Isolation, IBM Tech. Discl. Bulletin, vol. 25, No. 11B, Apr. 1983, pp. 6129–6130.
Eiden et al., "Geometry Independent Deep Trench Etching, Refill and Planarization for Isolation of Merged Bipolar–CMOS Devices", *Extended Abstracts,* vol. 84-2, *The Electrochemical Society, Incorporated,* Fall Meeting, Oct. 7–12, 1984, Abstract No. 398, pp. 570–571.

*Primary Examiner*—William A. Powell
*Attorney, Agent, or Firm*—Robert T. Mayer

[57] ABSTRACT

A technique for producing planarized semiconductor surfaces and for isolating semiconductor islands.

5 Claims, 7 Drawing Figures

FIG.1
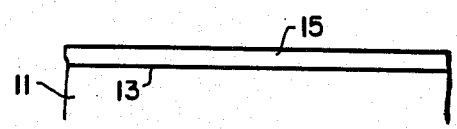
FIG.2
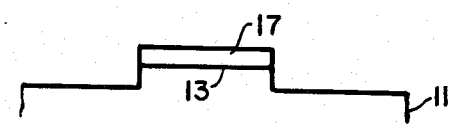
FIG.3
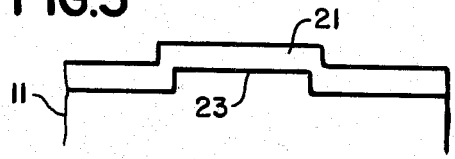
FIG.4
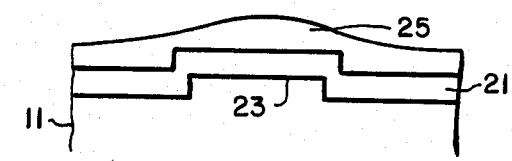
FIG.5
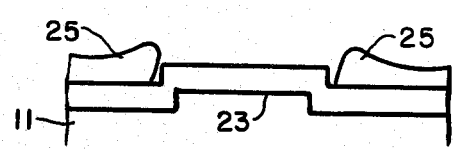
FIG.6
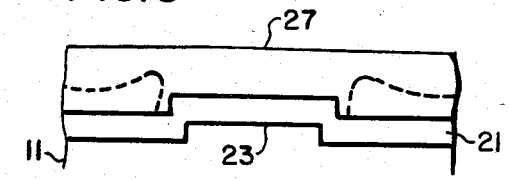
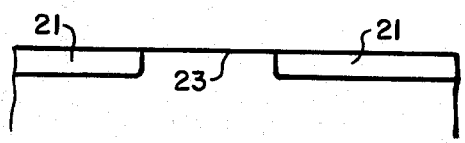
FIG.7

PLANARIZATION METHOD AND TECHNIQUE FOR ISOLATING SEMICONDUCTOR ISLANDS

This is an invention in semiconductor technology. More particularly, it is a method of planarization which is useful in fabricating on a silicon wafer a planarized surface of silicon islands surrounded by insulation.

Spun-on polymer coatings have been proposed for planarizing semiconductor device topographies. A smooth planar coating is desirable so that it can be transferred into the device topography. Practically speaking, smooth planar coatings have not been achievable because the spun-on coating tends to conform to the underlying topography of the device. Baking the coating to cause it to flow after application to improve its planarity has only been somewhat successful.

It is an object of this invention to obtain better planarized coatings.

One of the features of the invention is that it provides a novel method of isolating silicon islands on a wafer.

One of the advantages of the invention is that it can provide devices that are substantially more planar than previous methods.

In accordance with one way of practicing the invention there is provided a method of planarization of a surface of a semiconductor structure having steps of a certain height on its surface. The method includes coating the surface with a first photoresist layer. The first photoresist layer is then selectively exposed to light through a mask and developed so that the portion of the layer over the steps is removed. The remainder of the first layer and the steps are then coated with another photoresist layer of a desirable thickness which provides the desired planarization.

In accordance with another way of practicing the invention there is provided a method of fabricating on a semiconductor wafer a planarized surface of semiconductor islands surrounded by insulation. The method includes coating a surface of the wafer with a developed photoresist layer at those places where mesas are to be formed. The wafer surface is then etched until the mesas are formed. The photoresist is then removed and a dielectric is then deposited on the surface of the wafer including the mesas to form a dielectric layer. The wafer surface is then coated with a second photoresist layer. The second photoresist layer is selectively exposed to light through a mask and developed so that the portion of it over the mesas is removed. The remaining second layer and the mesas are then coated with a third photoresist layer of a desirable thickness. The photoresist layer is etched until the mesas and surrounding dielectric form a planarized surface of semiconductor islands surrounded by dielectric.

Further objects, advantages, and features of the present invention will become apparent to those skilled in the art from the following description and the drawing when considered in conjunction with the appended claims.

In the drawing:

FIG. 1 represents material being treated in accordance with the invention at an early stage of manufacture;

FIG. 2 represents the material of FIG. 1 at a later stage of manufacture;

FIG. 3 represents material under manufacture in accordance with the invention;

FIG. 4 represents the material of FIG. 3 at a later stage of manufacture;

FIG. 5 represents the material of FIG. 4 at a still later stage of manufacture;

FIG. 6 represents the material of FIG. 5 at a still later stage of manufacture; and FIG. 7 represents the material of FIG. 6 at a still later stage of manufacture.

The drawing is purely schematic and not to scale. This is especially true with respect to the thickness of the elements of the structure shown. The same elements in different figures of the drawing are identified by the same reference numerals.

Referring to FIG. 1 there is shown a p-type silicon wafer 11 whose top surface 13 is covered with a photoresist layer 15. After exposing the photoresist layer to light through a mask and developing it, a disk 17 (FIG. 2) of photoresist is left on wafer surface 13. The surface of wafer 11 not protected by disc 17 is then etched using a fluorine-based plasma to produce the structure shown in FIG. 2.

The photoresist disk 17 is stripped to expose surface 13. The surface of the wafer including that of mesa 23 (FIG. 3) is subjected to thermal oxidation 11 till an oxide thickness of about 2000 angstroms is formed. This passivates the surface and lessens the likelihood thereafter of electrical leakage. A dielectric such as silicon dioxide is then deposited by any well known method to produce layer 21. The thickness of layer 21 is approximately equal to the height of mesa 23.

Polymer photoresist layer 25 (FIG. 4) is then spun onto oxide layer 21. The thickness of the photoresist is also approximately equal to the height of mesa 23. Photoresist layer 25 is then exposed to light through an oversized mask and developed to produce the apertured structure shown in FIG. 5. The gap between mesa 23 and the remaining part of layer 25 is about equal to the alignment tolerance of the alignment machine used.

By spinning a second polymer photoresist layer onto the structure of FIG. 5 the structure of FIG. 6 is produced. As can be seen the second photoresist layer 27 fills in the aperture in the first layer 25 (shown in dotted form) to produce an enhanced planarized surface.

By etching photoresist layer 27 and silicon dioxide layer 21 in any suitable etchant, such as, carbon tetrafluoride and oxygen plasma, at approximately equal rates it can be seen from FIG. 7 that the planarity of the resist can be transferred into the oxide. Etching is stopped when the top of the silicon island 23 is exposed thereby resulting in a planar surface.

From the foregoing it can be seen that silicon islands can be isolated on a wafer in such a way as to result in an ideally planar surfaces. From the description it should also be clear that conventional NMOS devices could now be formed in p-type conductivity island 23. Alternatively CMOS devices could be fabricated with the addition of an n-well or by starting with n-type conductivity material and adding a p-well. For bipolar devices, a buried layer and an epitaxially deposited layer could be formed prior to the isolation techniques described. After isolation a bipolar transistor could be formed by any well known technique.

As those skilled in the art will understand the structure shown in FIG. 3 could represent a glass over metal step structure wherein the metal would be represented by island 23 and the glass by layer 21. Just such a structure was employed as a starting structure in practicing the invention. A negative polymer photoresist was spun on this structure. The height of the photoresist was approximately equal to that of the step. FIG. 4 represents such a structure in which layer 25 represents the negative photoresist and the other elements are as explained with reference to FIG. 3.

After exposure through a mask and development, the structure of FIG. 5 is produced. A further layer of negative photoresist is then applied. This produces the structure of FIG. 6 in which layer 27 represents the second photoresist layer. After baking to drive out excess solvents a carbon tetrafluoride and oxygen plasma is used to etch the resist and the glass. The gas flows are adjusted so that the glass and resist are etched at approximately the same rate in order to transfer the planarity of the resist into the glass. Etching is stopped when the metal is exposed leaving a structure represented by FIG. 7 with a planarized surface of metal island 23 surrounded by glass 21.

It is to be understood that whereas the foregoing describes developing photoresist by a method including exposure to light through a mask, other methods including exposure to other types of radiation are also possible.

From the foregoing it should be evident to those skilled in the art that various modifications of the methods described herein may be possible. For that reason the methods described are to be considered for illustrative purposes and not to be restrictive.

What is claimed is:

1. A method of planarization of a surface of a semiconductor structure having a step of a certain height on said surface, said step being a glass over metal step, said method including coating said surface with a first photoresist layer; selectively exposing said first photoresist layer to radiation and developing said layer so that a portion of the layer over said step is removed and that a portion adjoining said step remains; and coating the remainder of said first layer and said step with a second photoresist layer of a desirable thickness whereby the surface of said second layer is rendered smooth and planar.

2. A method according to claim 1, wherein said exposed radiation is light through a mask.

3. A method according to claim 2, wherein said first photoresist layer is as thick as said certain height.

4. A method according to claim 3, wherein said second photoresist layer and said glass are etched until a planarized surface of a metal island surrounded by glass is produced.

5. A method according to claim 4, wherein said semiconductor is silicon.

* * * * *